(12) United States Patent
Jagannathan et al.

(10) Patent No.: US 11,099,231 B2
(45) Date of Patent: Aug. 24, 2021

(54) STRESS TEST ON CIRCUIT WITH LOW VOLTAGE TRANSISTOR

(71) Applicant: NXP USA, INC., Austin, TX (US)

(72) Inventors: Srikanth Jagannathan, Austin, TX (US); Kumar Abhishek, Bee Cave, TX (US)

(73) Assignee: NXP USA, INC., Austin, TX (US)

( * ) Notice: Subject to any disclaimer, the term of this patent is extended or adjusted under 35 U.S.C. 154(b) by 165 days.

(21) Appl. No.: 16/587,666

(22) Filed: Sep. 30, 2019

(65) Prior Publication Data

US 2021/0096170 A1    Apr. 1, 2021

(51) Int. Cl.
*G01R 31/28* (2006.01)
*H03K 17/687* (2006.01)

(52) U.S. Cl.
CPC ..... *G01R 31/2879* (2013.01); *G01R 31/2856* (2013.01); *H03K 17/6871* (2013.01)

(58) Field of Classification Search
CPC .......... G01R 31/31924; G01R 31/2608; G01R 31/261; G01R 31/2612; G01R 31/2614; G01R 31/2616; G01R 31/2617; G01R 31/2619
See application file for complete search history.

(56) References Cited

U.S. PATENT DOCUMENTS

| 5,294,882 | A | 3/1994 | Tanaka |
| 5,656,944 | A | 8/1997 | Choi |
| 6,091,287 | A | 7/2000 | Salter et al. |
| 9,531,398 | B2 | 12/2016 | Ferguson et al. |
| 2005/0193302 | A1* | 9/2005 | Arguelles ......... G01R 31/31701 714/733 |
| 2010/0277150 | A1* | 11/2010 | Nagata ............... G01R 31/2884 323/282 |
| 2010/0283474 | A1* | 11/2010 | Fukuda .............. G01R 31/2635 324/501 |

FOREIGN PATENT DOCUMENTS

KR    970007977 B1    5/1997

OTHER PUBLICATIONS

Khalil, M., "High-Voltage Stress test Paradigms of Analog CMOS ICs for Gate-Oxide Reliability Enhancement", IEEE 2001.

* cited by examiner

*Primary Examiner* — Tung X Nguyen
(74) *Attorney, Agent, or Firm* — David G. Dolezal; Joanna G. Geld

(57) ABSTRACT

A current leg located in a voltage domain where the current leg includes a transistor of a current mirror having a maximum voltage rating of less than the voltage of the voltage domain. The current leg includes a resistive element circuit to provide a first resistance during a normal mode of operation of the current leg and a different resistance during of a stress test of the transistor in a test mode of the circuit.

20 Claims, 2 Drawing Sheets

STRESS TEST ON CIRCUIT WITH LOW VOLTAGE TRANSISTOR

BACKGROUND OF THE INVENTION

Field of the Invention

This invention relates to circuits with low voltage transistors and more specifically stress test circuitry for circuits with low voltage transistors.

Background

Transistors are utilized in electronic circuits. With some circuit implementations, the maximum voltage rating between any two terminals of a transistor is lower than the voltage domain of the circuit in which the transistor is implemented.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a current leg of a circuit is located in a voltage domain where the current leg includes a transistor of a current mirror having a maximum voltage rating of less than the voltage of the voltage domain. The current leg includes a resistive element circuit to provide a first resistance during a normal mode of operation of the current leg and different resistance during of a stress test of the transistor in a test mode of the circuit. Providing a current leg with a resistive circuit which provides different resistive values may in some embodiments enable the low voltage transistor to be stress tested where such tests would not be able to be effectively performed if the resistance during a normal mode of operation was utilized for the stress test.

Figure 1:
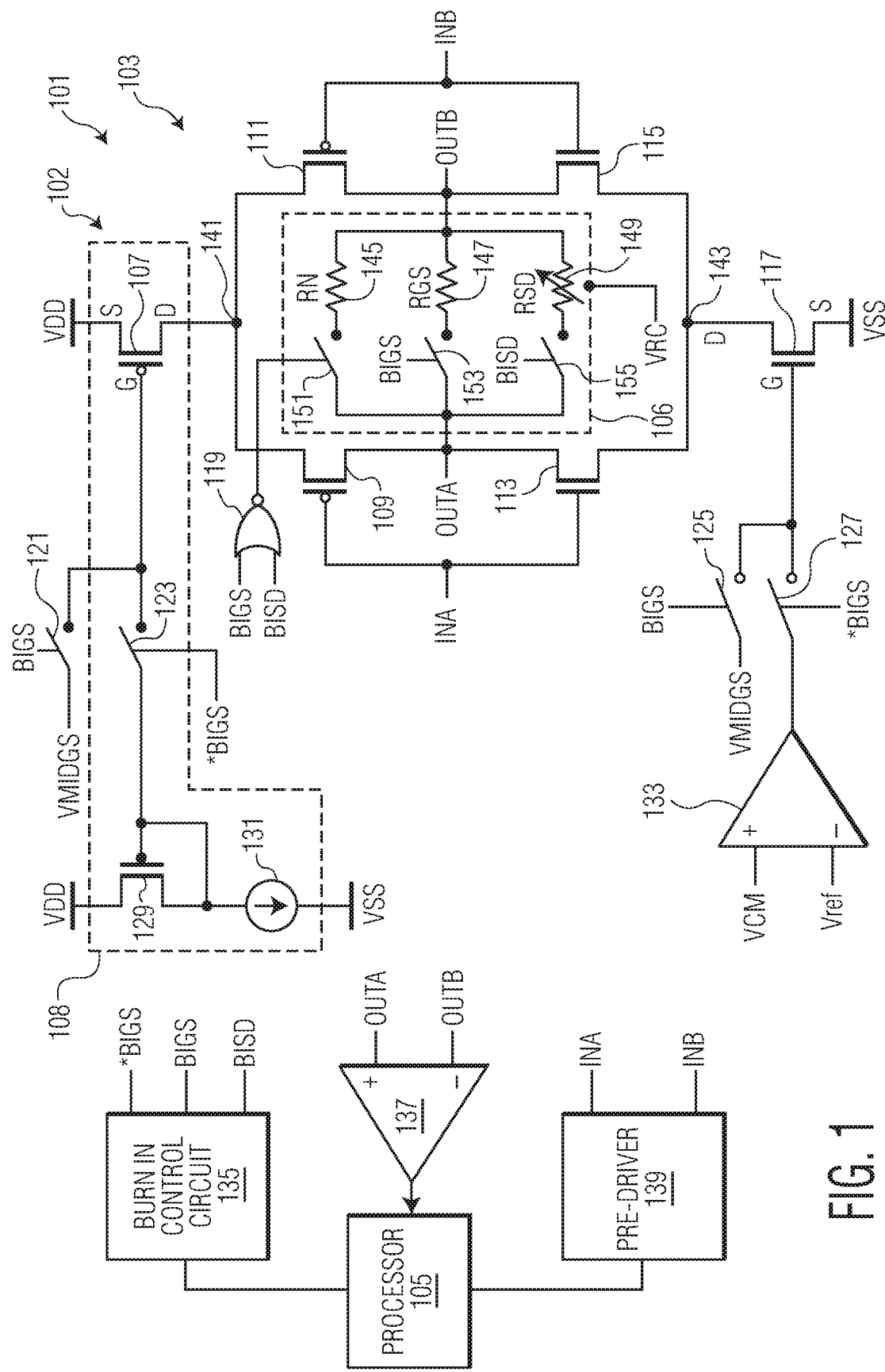
FIG. 1 is a circuit diagram of a portion of an integrated circuit including an analog output driver circuit according to one embodiment of the present invention.

FIG. 1 shows a circuit diagram of a portion of an integrated circuit 101 with a differential analog output driver circuit 103 according to one embodiment of the present invention. Driver circuit 103 includes two differential input terminals (INA, and INB) for receiving a differential input signal from a pre-driver circuit 139 and two differential output terminals (OUTA and OUTB) for providing an output differential signal externally. In one embodiment, output driver circuit 103 is part of a transmitter. In the embodiment shown, the differential input signal from pre-driver circuit 139 is generated from information generated by processor 105. Driver circuit 103 is implemented with a current leg 102 located in a voltage domain having a voltage of VDD minus VSS. In one embodiment, VDD minus VSS is equal to 1.8 volts (V), but may be other voltages in other embodiments. In one embodiment, the voltage domain of pre-driver circuit 139 is less than the voltage domain of VDD minus VSS.

Driver circuit 103 includes a PFET current source transistor 107 and a NFET current source transistor 117. Transistors 107 and 117 each have a maximum voltage rating of less than VDD minus VSS. In one embodiment, the maximum voltage rating of transistors 107 and 117 is 0.88 V, but may be of other values in other embodiments. A maximum voltage rating of a transistor is the maximum voltage that can be safely be applied across any of the terminals of a transistor (e.g. gate, source, drain, body of a FET) for normal operation without breakdown. In one embodiment, lower voltage transistors have a higher conductivity per transistor area. Accordingly, using lower voltage transistors in a higher voltage domain may allow for a higher current output per integrated circuit area. Driver circuit 103 also includes PFETs 109 and 111 and NFETs 113 and 115, which are implemented in an inverter configuration between nodes 141 and 143. In one embodiment, transistors 109, 111, 113, and 115 have a maximum voltage rating (1.98V), which is greater than the voltage domain of VDD minus VSS (1.8 V).

Driver circuit 103 includes a resistive circuit 106 that is capable of providing different resistive values between the output terminals during different modes of operation. In the embodiment shown, resistive circuit 106 includes resistors 145, 147, and 149, each for providing circuit 106 with a different resistive value (RN, RGS, and RSD) via the assertion of switches 151, 153, and 155, respectively. Circuit 101 includes a NOR gate 119 that closes switch 151 when not in a test mode.

During operation, when node INA is at a high voltage and node INB is at a complementary low voltage, the current through transistor 107 flows from transistor 111 through resistive circuit 106 through transistor 113. When the INA node is at a low voltage and the INB node is at a complementary high voltage, the current through transistor 107 flows from transistor 109 through resistive circuit 106 through transistor 115. During a normal mode of operation, switch 151 is closed such that circuit 106 provides a resistance of RN from resistor 145 between nodes OUTA and OUTB. In one embodiment, RN is about 100 ohms, but may be of other values in other embodiments. As will be described later, the other resistors 145 and 149 provide resistive values used during stress testing.

Current source transistor 107 is part of a current mirror 108 that includes transistor 129 and current source 131. During a normal mode of operation, the current through current leg 102 is proportional to the current of current source 131.

During a normal mode of operation, the gate of transistor 117 is biased by the output of amplifier 133 (through closed switch 127) so that the common mode voltage (VCM) of the output nodes OUTA and OUTB matches VREF. In one embodiment, VREF is a midpoint voltage between VDD and VSS. In one embodiment, VCM is connected to a node between two symmetric and relatively large resistors (not shown) that are coupled in series between nodes OUTA and OUTB. In one embodiment the relatively large resistors are in the range of 5K-10K ohms, but may be of other values in other embodiments.

During normal operation, the input signal from pre-driver circuit 139 is provided as a differential signal where nodes INA and INB are at complementary voltage values depending on the desired signal value. If node INA is at a higher voltage and complementary node INB is at a lower voltage, then transistors 113 and 111 become conductive and transistors 109 and 115 are non-conductive where the current through transistor 107 flows through node 141, transistor 111, resistor 145, closed switch 151, transistor 113, node 143, and transistor 117. In such a condition, the voltage of node OUTB will be a higher voltage than the voltage of the complementary node OUTA. If node INB is at a higher voltage value and complementary node INA is at a lower value, then transistors 109 and 115 become conductive and transistors 111 and 113 are non-conductive where the current flows through transistor 107, node 141, transistor 109, resistor 145, closed switch 151, transistor 115, node 143, and transistor 117. In such a condition, the voltage of node OUTA will be a higher voltage than the voltage of complementary node OUTB.

In some embodiments it is desirable to stress test the devices of integrated circuit 101 to determine whether devices of the circuit are defective or not. Stress testing may be performed at burn-in prior to an integrated circuit being provided to a customer. A stress test is where a stress voltage is applied across at least two terminals of a device of a circuit that is higher than a voltage applied across the at least two terminals during normal operation to determine if the device is defective or will prematurely fail before the end of life of the chip. In some embodiments, the stress voltage applied during a stress test is higher than the maximum voltage rating of the device. With some stress tests, a gate-source voltage above a maximum gate-source rating is applied between the gate and source of a transistor. In other stress tests, a source-drain voltage above the maximum source-drain voltage rating is applied between to the source and drain of a transistor. In some embodiments, the stress test voltage is 20-25% higher than the nominal operating voltages applied to the devices. Other embodiments may include other types of stress tests.

In a current leg with a current mirror transistor (107) and a fixed resistive load (e.g. a circuit that has only resistor 145), difficulty may arise in applying a stress test to the current mirror transistor (107). If the voltage of the current leg is raised (e.g. if VDD is raised or VSS is lowered) then the drain voltage of transistor 107 will increase accordingly in that the increased voltage between VDD and VSS will be mostly dropped across the resistive load (145) and not across the source-drain of the current source transistor (107). Accordingly, the source-drain of a current source transistor in such a configuration (where the resistive load value is the normal operating resistance of resistor 145) is not adequately stressed tested to determine whether the part will fail in the near future. In the example of FIG. 1, transistor 107 (or transistor 117) cannot be sufficiently stressed tested by simply raising VDD by 10-20%, in that the increased voltage will be mainly dropped across the resistive load (e.g. RN) and not the source-drains of transistors 107 and 117.

Likewise, if the voltage differential of VDD minus VSS is raised from its normal operating value, the gate voltage of current source transistor 107 will not fall sufficiently to generate a voltage difference from VDD to increase the gate-source voltage of transistor 107 adequately to stress transistor 107. Because the gate of transistor 107 is connected to the gate and drain of transistor 129 and connected to current source 131, the voltage on the gate of transistor 129 will rise with the increase in VDD to maintain the same current through transistor 129 (the current of current source 131). Accordingly, as VDD rises, the gate voltage of transistor 107 rises. Therefore, the gate-source voltage of transistor 107 will not be sufficiently stress tested.

In one example, assume that a gate-source voltage and source-drain voltage of 0.96 Volts would need to be applied to transistors 107 and 117 to adequately stress test the transistors. Also assume that circuit 106 only had resistor 145 (e.g. 100 ohms). During one example of a stress test where VDD minus VSS is raised to 1.98 V (as opposed to 1.8V during normal operation), the voltage at the gate of transistor 107 would be at 1.51V, the voltage at node 141 would be at 1.37V, the voltage of either node INA or INB would be at 1.98V and the other node would be at 0V (depending on the input signal state), the voltage of node 143 would be at 0.6V, and the gate of transistor 117 would be at 0.32V. In such conditions, the source-gate voltage of transistor 107 would be 0.47V, the source-drain voltage of transistor would be 0.51V, the gate-source voltage of transistor 117 would be 0.32V, and the source-drain voltage of transistor 117 would be 0.6V. In such conditions, transistors 107 and 117 would not be adequately stress tested.

In order to adequately stress test transistors 107 and 117, circuit 101 includes circuitry for applying gate-source voltages and source-drain voltages to transistors 107 and 117 outside of their maximum voltage ratings. Circuit 101 includes a burin in control circuit 135 for providing control signals BIGS, *BIGS, and BISD during stress tests. Signal BIGS is asserted at a high voltage level and signal *BIGS is asserted at a low voltage level to perform a gate-source stress test of transistors 107 and 117. Signal BISD is asserted at a high voltage level to perform a source-drain stress test on transistors 107 and 117.

During a gate-source stress test of transistors 107 and 117, signals BIGS and *BIGS are asserted to close switches 121 and 125 and open switches 123 and 127 so that a VMIDGS voltage is applied to the gates of transistors 107 and 117. VMIDGS is a voltage that is halfway between voltage VDD and voltage VSS. In one embodiment, VMIDGS is provided by a high resistance voltage divider (not shown) between VDD and VSS. Also, during a gate-source stress test, switch 153 is closed and switches 151 and 155 are open for resistive circuit 106 to provide the resistance RGS during the gate-source stress test. In one embodiment, RGS is 500 ohms, which is higher than RN (100 ohms). In one embodiment, increasing the resistance of circuit 106 during a gate-source voltage stress test reduces the current through nodes 141 and 143 to where most of the voltage drop of leg 102 occurs between nodes 141 and 143 (e.g. node 141 is near VDD and node 143 is near VSS). In one embodiment, the switches shown in FIG. 1 are implemented with NFETS, but may be implemented with other kinds of transistors in other embodiments (e.g. pass gates).

In one embodiment, during a gate-source stress test where the difference between VDD and VSS is 1.98V and VMIDGS is 0.99V, the gate-source voltages applied to transistors 107 and 117 is 0.99 V. If the maximum voltage rating is 0.88V, then the gate-source voltage is above the required level to stress transistors 107 and 109 during the stress test.

During a gate-source stress test, processor 105 controls the information provided to nodes INA and INB (through pre-driver circuit 139). Circuit 101 includes a comparator 137 whose inputs are coupled to nodes OUTA and OUTB to provide a single ended signal to processor 105 that is indicative of the values provided by the output of circuit 103. If the data provided to pre-driver circuit 139 does not match the data received from comparator 137, then circuit 103 is deemed to have failed the stress test.

During a source-drain stress test of transistors 107 and 117, the BISD signal is asserted to close switch 155. Because the BIGS signal is not asserted during this time, switches 151 and 153 are open such that circuit 106 provides the resistance RSD of variable resistor 149. In some embodiments, variable resistor 149 is controlled by signal VRC such that very little of the voltage differential of VDD minus VSS is dropped across resistor 149 during the source-drain stress test. In other embodiments, resistor 149 is a fixed resistor (e.g. 10 ohms). Also, during a source-drain stress test, switches 123 and 127 are closed and switches 121 and 125 are open so current mirror 108 is operable and the output of amplifier 133 is provided to the gate of transistor 117.

During a source-drain stress test, because the amount of resistance provided by variable resistor 149 is relatively small, most of the voltage differential of VDD minus VSS is dropped across the source-drains of transistors 107 and 117. For example, if VDD minus VSS is 1.98 volts, the source-drain voltage drop across transistor 107 is 0.93 volts and the source-drain voltage drop across transistor 117 is 0.9 volts, both of which is higher than the maximum voltage rating of either transistor (0.88 volts) in some embodiments.

As with the gate-source stress tests, values generated by processor 105 (through pre-driver circuit 139) are applied to circuit 103. A test failure occurs where the values read from comparator 137 do not match the values provided to pre-driver circuit 139.

Figure 2:
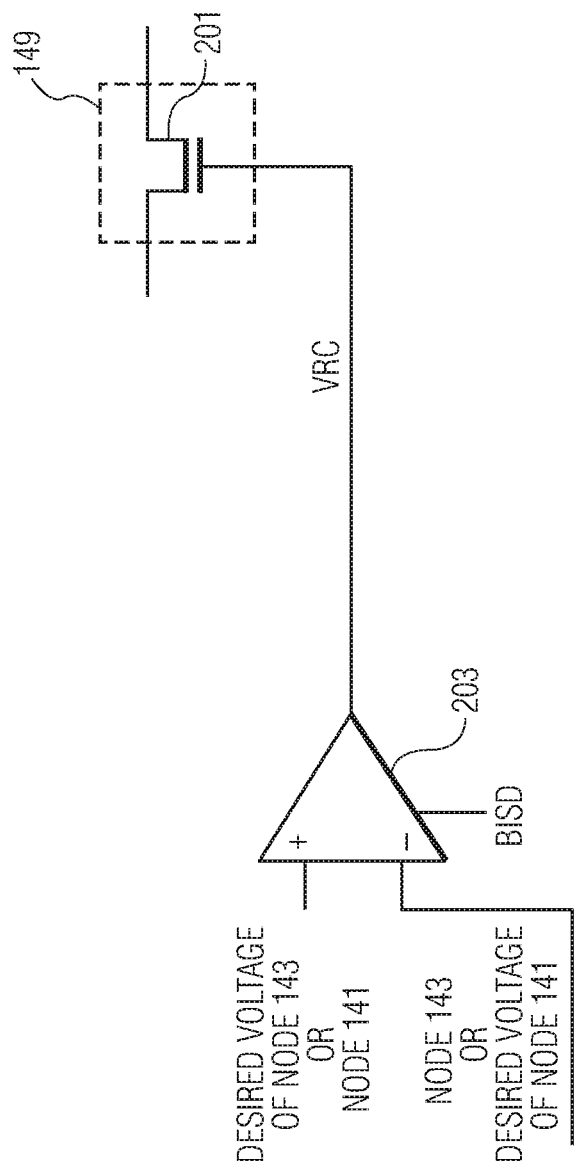
FIG. 2 is a circuit diagram of a variable resistor control circuit according to one embodiment of the present invention.

FIG. 2 is a circuit diagram showing one embodiment of a variable resistor 149 and a circuit for generating VRC according to one embodiment of the present invention. In the embodiment shown, variable resistor 149 is implemented as an NFET 201. Signal VRC is generated by comparator 203. Comparator 203 is enabled by the BISD signal.

In one embodiment, the inverting input of comparator 203 is connected to node 143 and the non-inverting input is connected to a reference voltage that is the desired voltage of node 143 during a source-drain stress test. In one embodiment, the desired voltage of node 143 is the desired source-drain voltage of transistor 117 (e.g. 0.9 V) during a source-drain stress test. During a source-drain stress test, if the desired voltage of node 143 is greater than the actual voltage of node 143, then the voltage of the output of comparator 203 increases such that the resistance of NFET 201 decreases to pull the voltage of node 143 higher until it matches the desired voltage. If the voltage of node 143 is higher than the desired voltage, then the output of comparator 203 goes lower to increase the resistance of NFET 201 to where the voltage of node 143 drops to match the desired voltage of node 143.

In another embodiment, the inverting input of comparator 203 is connected to the desired voltage of node 141 and the non-inverting input is connected to node 141 during a stress test. In one embodiment, the desired voltage of node 141 is VDD minus the desired source-drain voltage of transistor 107 (e.g. 0.92V) during a source-drain stress test. During a source-drain stress test, if the desired voltage of node 141 is greater than the actual voltage of node 141, then the voltage of the output of comparator 203 decreases such that the resistance of NFET 201 increases to pull the voltage of node 141 higher until it matches the desired voltage of node 141. If the voltage of node 141 is greater than the desired voltage of node 141, then the output of comparator 203 increases to decrease the resistance of NFET 201 to where the voltage of node 141 drops to match the desired voltage of node 141. Other types of variable resistors and/or other control configurations maybe utilized in other embodiments.

Although the current source transistor 107 of a current mirror 108 being tested is incorporated in a current leg 102 with a resistive load of an output analog driver circuit 103, in other embodiments, other current source transistors in current legs with resistive loads may be stress tested with similar circuitry. For example, a current mirror transistor in a memory or operational amplifier circuit may be tested with similar circuitry. Also, in other embodiments, the current source transistor of a current mirror being tested may be an NFET (e.g. with its source connected to VSS and its drain coupled to the resistive load).

Providing circuitry for testing a current source transistor in a current leg with a test resistive load that is different from a normal resistive load enables the current source transistor to be effectively stress tested (e.g. a source-drain test, a gate-source test) such as e.g. during burn in. Accordingly, a better evaluation of the quality and longevity of the circuit can be made. Which such circuitry, defects in the circuit can be more easily identified thereby decreasing the probability of defective products being provided to customers.

In one embodiment, an integrated circuit includes a current leg coupled between a high supply voltage terminal and a low supply voltage terminal. The high supply voltage terminal receives a high supply voltage and the low supply voltage terminal receives a low supply voltage which is less than the high supply voltage. The current leg includes a transistor of a current mirror. A maximum voltage rating of the transistor is less than a voltage differential between the high supply voltage and the low supply voltage. The current leg includes a resistive circuit coupled in series with the transistor between the high supply voltage terminal and the low supply voltage terminal. The resistive circuit is configured to provide a first resistance during a normal mode of operation of the current leg and a second resistance during a test mode of operation of the current leg in which a stress test is performed on the transistor. The first resistance is different form the second resistance.

As set forth in another embodiment, in an integrated circuit located in a power domain powered by a high supply voltage and a low supply voltage, in which the high supply voltage is greater than the low supply voltage, the integrated circuit includes a transistor in a current leg of the power domain. A method includes during a normal mode of operation, setting a resistive circuit in the current leg to a first resistance. The current leg is coupled between a terminal receiving the high supply voltage and a terminal receiving the low supply voltage, and the transistor is part of a current mirror of the power domain. The transistor has a maximum voltage rating that is less than a voltage differential between the high and low supply voltages during a normal mode of operation. The method includes during a test mode of operation, configuring the integrated circuit into a first configuration. The configuring comprises setting the resistive circuit in the current leg to a second resistance, different from the first resistance, so as to apply a stress voltage across at least two terminals of the transistor. The stress voltage is greater than the maximum voltage rating but less than the voltage differential between the high and low supply voltages during the test mode.

In another embodiment, an integrated circuit includes a first transistor of a current mirror. The first transistor includes a source electrode coupled to receive a first supply voltage and a drain electrode coupled to a first internal node of an output driver circuit, wherein the output driver circuit includes a first output node, a second output node, and a resistive circuit coupled between the first and second output nodes, wherein the first and second output nodes provide a differential output signal. The integrated circuit includes a second transistor having a drain electrode coupled to a second internal node of the output driver circuit and a source electrode coupled to receive a second supply voltage. A voltage differential between the first and second supply voltages exceeds a maximum voltage rating of each of the first and second transistors. The integrated circuit includes control circuitry configured to, during a normal mode of operation, provide a first bias voltage to a gate electrode of the first transistor and a second bias voltage to a gate electrode of the second transistor and set a resistance of the resistive circuit to provide a first resistance. The control circuitry is configured to, during a test mode of operation for a stress test, set the resistance of the resistive circuit to provide a second resistance different from the first resistance so as to apply a first stress voltage across at least two terminals of the first transistor and a second stress voltage across at least two terminal of the second transistor. The first stress voltage and the second stress voltage are each less than a voltage differential between the first and second supply voltages during the stress test.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit, comprising:
 a current leg coupled between a high supply voltage terminal and a low supply voltage terminal, wherein the high supply voltage terminal receives a high supply voltage and the low supply voltage terminal receives a low supply voltage which is less than the high supply voltage, wherein the current leg includes:
  a transistor of a current mirror, wherein a maximum voltage rating of the transistor is less than a voltage differential between the high supply voltage and the low supply voltage; and
  a resistive circuit coupled in series with the transistor between the high supply voltage terminal and the low supply voltage voltage terminal, wherein the resistive circuit is configured to provide a first resistance during a normal mode of operation of the current leg and a second resistance during a test mode of operation of the current leg in which a stress test is performed on the transistor, the first resistance is different form the second resistance.

2. The integrated circuit of claim 1, wherein, during the normal mode of operation, a first bias voltage from a first voltage source is provided to a gate of the transistor such that no voltage across terminals of the transistor exceeds the maximum voltage rating of the transistor.

3. The integrated circuit of claim 2, wherein during a test mode, the integrated circuit is placed in a first configuration in which the gate of the transistor is coupled to receive a second bias voltage from a second voltage source instead of the first bias voltage and the second resistance is greater than the first resistance, such that a stress voltage is provided as a gate-source voltage of the transistor.

4. The integrated circuit of claim 3, wherein the stress voltage provided as the gate-source voltage of the transistor is greater than the maximum voltage rating of the transistor and less than the voltage differential between the high supply voltage and the low supply voltage.

5. The integrated circuit of claim 3, wherein during a test mode, the integrated circuit is placed in a second configuration in which the gate of the transistor is coupled to receive the first bias voltage and the resistive circuit is configured to provide a third resistance that is less than the first resistance such that a second stress voltage is provided as a source-drain voltage of the transistor.

6. The integrated circuit of claim 1, wherein during a test mode, the integrated circuit is placed in a first configuration and the second resistance is less than the first resistance such that a stress voltage is provided as a source-drain voltage of the transistor.

7. The integrated circuit of claim 6, wherein the source-drain voltage of the transistor is greater than the maximum voltage rating of the transistor and less than the voltage differential between the high supply voltage and the low supply voltage.

8. The integrated circuit of claim 6 wherein the gate of the transistor is coupled to the gate and drain of a second transistor of the current mirror during the normal mode of operation and when the integrated circuit is placed in the first configuration.

9. The integrated circuit of claim 1, wherein a gate of the transistor is coupled to a gate and a first current electrode of a second transistor of the current mirror of a second current leg during the normal mode of operation, such that the first current electrode of the second transistor provides a bias voltage.

10. The integrated circuit of claim 9, wherein a second current electrode of the second transistor is coupled to one of the high supply voltage terminal or the low voltage supply terminal, and the second current electrode of the second transistor is coupled to the other of the high supply voltage terminal or the low voltage supply terminal via a current source.

11. The integrated circuit of claim 1, wherein the integrated circuit comprises an output driver circuit that includes the current leg.

12. In an integrated circuit located in a power domain powered by a high supply voltage and a low supply voltage, in which the high supply voltage is greater than the low supply voltage, the integrated circuit includes a transistor in a current leg of the power domain, a method comprising:
 during a normal mode of operation, setting a resistive circuit in the current leg to a first resistance, wherein the current leg is coupled between a terminal receiving the high supply voltage and a terminal receiving the low supply voltage, and the transistor is part of a current mirror of the power domain, the transistor has a maximum voltage rating that is less than a voltage differential between the high and low supply voltages during a normal mode of operation; and
 during a test mode of operation, configuring the integrated circuit into a first configuration, wherein the configuring comprises setting the resistive circuit in the current leg to a second resistance, different from the first resistance, so as to apply a stress voltage across at least two terminals of the transistor, wherein the stress voltage is greater than the maximum voltage rating but less than the voltage differential between the high and low supply voltages during the test mode.

13. The method of claim 12, wherein, during the test mode of operation, the configuring the integrated circuit into the first configuration comprises:
 providing a second bias voltage to a gate electrode of the transistor that is different from a first bias voltage provided to the gate electrode of the transistor so that the stress voltage is applied as a gate-source voltage of the transistor, wherein the second resistance is greater than the first resistance.

14. The method of claim 12, wherein, during the test mode of operation, the configuring the integrated circuit into a first configuration includes the second resistance being less than the first resistance and the stress voltage is applied as a source-drain voltage of the transistor.

15. The method of claim 14, wherein the resistive circuit comprises a variable resistor, wherein during the test mode of operation, setting the resistive circuit in the current leg to the second resistance comprises:
comparing a voltage of the current leg to a desired voltage of the current leg and adjusting a resistance of the variable resistor such that the voltage of the current leg matches the desired voltage of the current leg.

16. An integrated circuit, comprising:
a first transistor of a current mirror, wherein the first transistor includes a source electrode coupled to receive a first supply voltage and a drain electrode coupled to a first internal node of an output driver circuit, wherein the output driver circuit includes a first output node, a second output node, and a resistive circuit coupled between the first and second output nodes, wherein the first and second output nodes provide a differential output signal;
a second transistor having a drain electrode coupled to a second internal node of the output driver circuit and a source electrode coupled to receive a second supply voltage, wherein a voltage differential between the first and second supply voltages exceeds a maximum voltage rating of each of the first and second transistors; and
control circuitry configured to, during a normal mode of operation, provide a first bias voltage to a gate electrode of the first transistor and a second bias voltage to a gate electrode of the second transistor and set a resistance of the resistive circuit to provide a first resistance, the control circuitry configured to, during a test mode of operation:
for a stress test, set the resistance of the resistive circuit to provide a second resistance different from the first resistance so as to apply a first stress voltage across at least two terminals of the first transistor and a second stress voltage across at least two terminal of the second transistor, wherein the first stress voltage and the second stress voltage are each less than a voltage differential between the first and second supply voltages during the stress test.

17. The integrated circuit of claim 16 wherein the first stress voltage is greater than the maximum voltage rating of the first transistor and the second stress voltage is greater than the maximum voltage rating of the second transistor.

18. The integrated circuit of claim 16 wherein control circuitry is configured to during the test mode of operation, for the stress test, provide a third bias voltage different from the first bias voltage to the gate electrode of the first transistor and a fourth bias voltage different from the second bias voltage to the gate electrode of the second transistor and set the second resistance of the resistive circuit to be greater than the first resistance, wherein the first stress voltage is a gate-source voltage of the first transistor and the second stress voltage is a gate-source voltage of the second transistor.

19. The integrated circuit of claim 18, further comprising:
a third transistor in the current mirror wherein a source electrode of the third transistor is coupled to receive the first supply voltage, and a gate electrode of the third transistor is connected to a drain electrode of the third transistor, wherein:
for the normal mode of operation, the drain electrode of the third transistor is connected to the gate electrode of the first transistor to provide the first bias voltage, and
for the stress test, the gate electrode of the first transistor is not connected the drain electrode of the third transistor and the third bias voltage is provided by another voltage source.

20. The integrated circuit of claim 17 wherein control circuitry is configured to during the test mode of operation, for the stress test provide the first bias voltage to the gate electrode of the first transistor and the second bias voltage to the gate electrode of the second transistor, and set the second resistance of the resistive circuit to be less than the first resistance, wherein the first stress voltage is a source-drain voltage of the first transistor and the second stress voltage is a source-drain voltage of the second transistor.

* * * * *